(12) United States Patent
Miao et al.

(10) Patent No.: US 9,912,295 B1
(45) Date of Patent: Mar. 6, 2018

(54) POWER-EFFICIENT PROGRAMMABLE BROADBAND HIGH-PASS PREAMPLIFIER SYSTEMS

(71) Applicant: Marvell International Ltd., Hamilton (BM)

(72) Inventors: Xiao Yu Miao, Singapore (SG); Peng Sun, Singapore (SG); Shilpa Kumar, Singapore (SG)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/260,790

(22) Filed: Sep. 9, 2016

Related U.S. Application Data

(60) Provisional application No. 62/216,743, filed on Sep. 10, 2015.

(51) Int. Cl.
*H03F 3/45* (2006.01)
*H03F 1/02* (2006.01)
*H03F 3/195* (2006.01)
*H03H 7/06* (2006.01)

(52) U.S. Cl.
CPC .......... *H03F 1/0205* (2013.01); *H03F 3/195* (2013.01); *H03F 2200/168* (2013.01); *H03F 2200/451* (2013.01); *H03H 7/06* (2013.01)

(58) Field of Classification Search
CPC ....................................................... H03F 3/45

USPC .................................................... 330/252, 69
See application file for complete search history.

(56) References Cited

U.S. PATENT DOCUMENTS

| | | | | |
|---|---|---|---|---|
| 6,914,479 | B1* | 7/2005 | Gabillard | H03F 3/45278 330/252 |
| 8,502,719 | B2* | 8/2013 | Ashburn, Jr. | H03M 3/368 341/143 |
| 8,849,227 | B2* | 9/2014 | Feng | H04B 17/0085 329/319 |
| 2009/0295481 | A1* | 12/2009 | Lin | H03F 3/3028 330/253 |
| 2011/0124307 | A1* | 5/2011 | Balankutty | H04B 1/12 455/296 |
| 2014/0070889 | A1* | 3/2014 | Chen | H03F 1/0211 330/295 |
| 2015/0063509 | A1* | 3/2015 | Hedayati | H04B 15/005 375/350 |

* cited by examiner

*Primary Examiner* — Henry Choe

(57) ABSTRACT

A method for pre-amplifying an input voltage signal to a pre-amplified voltage signal. The method includes receiving the input voltage signal; obtaining a high-pass filtered voltage signal by applying a high-pass filter to the input voltage signal; processing the high-pass filtered voltage signal to a current signal that corresponds to the high-pass filtered voltage signal; transmitting the current signal through a differential transmission line; converting the transmitted current signal to a converted voltage signal that corresponds to the high-pass filtered voltage signal; and outputting the converted voltage signal as the pre-amplified voltage signal. An integrated circuit chip implementing the method is also disclosed.

20 Claims, 6 Drawing Sheets

POWER-EFFICIENT PROGRAMMABLE BROADBAND HIGH-PASS PREAMPLIFIER SYSTEMS

CROSS-REFERENCE TO RELATED APPLICATIONS

This disclosure claims priority to U.S. Provisional Application Ser. No. 62/216,743, filed on Sep. 10, 2015, the disclosure of which is incorporated herein by reference in its entirety.

BACKGROUND

Broadband mixed signal processing systems, e.g., in hard disk preamplifiers and optical receiver preamplifiers, typically include preamplifier systems.

Conventional preamplifier systems are configured to (i) form a sensor signal, (ii) high-pass filter the sensor signal, (iii) transmit the high-pass filtered signal through a trace (e.g., a differential transmission line) having large parasitic capacitance caused by a trace length in a range from hundreds of microns to more than one millimeter, and (iv) deliver a voltage signal to a gain stage. A voltage buffer used in conventional preamplifier systems is configured to present a very large input impedance to the high-pass filtered signal, and to output the high-pass filtered signal across a very small output impedance prior to transmission via the trace of the high-pass filtered signal to the gain stage. However, transmission of the high-pass filtered voltage signal over such a trace tends to be lossy.

SUMMARY

In this specification, implementations of power efficient, broadband high-pass preamplifier systems are described that are suitable to be used in broadband mixed signal processing systems, e.g., in hard disk preamplifiers and optical receiver preamplifiers. In an embodiment, by converting a high-pass filtered voltage signal into a corresponding current signal, the current signal is transported without degradation over a relatively long differential trace, and then converted back to a voltage signal to be input, at a relatively close proximity, into a gain stage.

One aspect of the disclosure is implemented as a preamplifier system for pre-amplifying an input voltage signal to a pre-amplified voltage signal. The preamplifier system includes first circuitry configured to receive the input voltage signal; high-pass filter the input voltage signal to obtain a high-pass filtered voltage signal; and process the high-pass filtered voltage signal to obtain a current signal that corresponds to the high-pass filtered voltage signal. Additionally, the preamplifier system includes second circuitry configured to receive the current signal from the first circuitry through a differential transmission line; convert the received current signal to obtain a converted voltage signal that corresponds to the high-pass filtered voltage signal; and output the converted voltage signal as the pre-amplified voltage signal.

Implementations suitably include one or more of the following features. In some implementations, the high-pass filter operation is performed by the first circuitry in a programmatic manner. In some implementations, the first circuitry is configured to maintain constant a level of the current signal transmitted over the differential transmission line. In some implementations, the first circuitry is configured to control a level of the current signal transmitted over the differential transmission line, and the control operation is performed by the first circuitry in a programmatic manner. In some implementations, the second circuitry is configured to present to the transmitted current signal an input impedance lower than output impedance of the differential transmission line.

In some implementations, the first circuitry is configured to receive a sensor signal from a sensor; and form the input voltage signal from the received sensor signal. In some implementations, the second circuitry is configured receive the pre-amplified voltage signal; and amplify the received pre-amplified voltage signal from the received sensor signal.

In some implementations, the first circuitry, the differential transmission line and the second circuitry is implemented on a single integrated circuit chip. In some implementations, the preamplifier system is a system on chip.

In some implementations, the preamplifier system can include two or more instances of the first circuitry each of which configured to receive a respective voltage signal and obtain a respective current signal that corresponds to an associated input voltage signal that has been high-pass filtered. Here, the second circuitry is configured to receive from each instance of the first circuitry the respective current signal through a corresponding one of two or more differential transmission lines, and convert the respective current signal to an associated pre-amplified voltage signal that corresponds to the associated input voltage signal that has been high-pass filtered. In some cases, the preamplifier system can include a current signal multiplexer configured to multiplex the two or more current signals transmitted through the respective two or more differential transmission lines, and provide a multiplexed current signal to the second circuitry. In other cases, respective parasitic capacitances of the two or more differential transmission lines are different for at least some of the two or more differential transmission lines.

In some implementations, the preamplifier system can include two or more instances of the first circuitry each of which configured to receive a respective voltage signal and obtain a respective current signal that corresponds to an associated input voltage signal that has been high-pass filtered; and two or more instances of the second circuitry each of which configured to receive from a corresponding instance of the first circuitry the respective current signal through a corresponding one of two or more differential transmission lines, and convert the respective current signal to an associated pre-amplified voltage signal that corresponds to the associated input voltage signal that has been high-pass filtered. In some cases, the preamplifier system can include a voltage signal multiplexer configured to multiplex the two or more pre-amplified voltage signals provided by the respective instances of the second circuitry, and output a multiplexed pre-amplified voltage signal. In other cases, respective parasitic capacitances of the two or more differential transmission lines are different for at least some of the two or more differential transmission lines.

Another aspect of the disclosure is implemented as a method for pre-amplifying an input voltage signal to a pre-amplified voltage signal. The method includes receiving the input voltage signal; obtaining a high-pass filtered voltage signal by applying a high-pass filter to the input voltage signal; processing the high-pass filtered voltage signal to a current signal that corresponds to the high-pass filtered voltage signal; transmitting the current signal through a differential transmission line; converting the transmitted current signal to a converted voltage signal that corresponds to the high-pass filtered voltage signal; and outputting the converted voltage signal as the pre-amplified voltage signal.

Implementations suitably include one or more of the following features. In some implementations, the high-pass filter is applied in a programmatic manner. In some implementations, the method includes maintaining constant a level of the current signal transmitted over the differential transmission line. In some implementations, the method includes controlling, in a programmatic manner, a level of the current signal transmitted over the differential transmission line. In some implementations, the method includes presenting to the transmitted current signal an input impedance lower than output impedance of the differential transmission line.

In some implementations, the method includes receiving a sensor signal from a sensor; and forming the input voltage signal from the received sensor signal. In some implementations, the method can include receiving the pre-amplified voltage signal; and amplifying the received pre-amplified voltage signal from the received sensor signal.

In some implementations, the method includes receiving two or more voltage signals and obtaining two or more current signals that correspond to the respective input voltage signals that have been high-pass filtered; transmitting the two or more current signals through corresponding two or more differential transmission lines; and converting the transmitted current signals to respective two or more pre-amplified voltage signals that correspond to the two or more input voltage signals that have been high-pass filtered. In some cases, the method can include multiplexing the two or more current signals transmitted through the respective two or more differential transmission lines to a multiplexed current signal prior to converting the multiplexed current signal to a multiplexed pre-amplified voltage signal. In other cases, the method can include multiplexing the two or more pre-amplified voltage signals to a multiplexed pre-amplified voltage signal.

Yet another aspect of the disclosure is implemented as an integrated circuit chip including a high-pass filter; a transconductance amplifier, where an input of the transconductance amplifier is coupled with an output of the high-pass filter; a current-to-voltage convertor; and a differential transmission line having a first end coupled with an output of the transconductance amplifier, and a second, opposing end coupled with an input of the current-to-voltage convertor.

Implementations suitably include one or more of the following features. In some implementations, the high-pass filter includes a resistive portion coupled between the input of the transconductance amplifier and the output of the transconductance amplifier; and a capacitive portion coupled between the input of the high-pass filter and the input of the transconductance amplifier. In some cases, the resistive portion of the high-pass filter includes variable resistors.

In some implementations, the integrated circuit chip includes a pair of field-effect transistors (FETs); sources of the FETs are coupled together; gates of the FETs are coupled with the input of the transconductance amplifier; and drains of the FETs are coupled with the output of the transconductance amplifier. In some cases, the integrated circuit chip includes a gain controller coupled with the transconductance amplifier at the sources of the FETs. Here, the gain controller includes a first current mirror including a resistor corresponding to transconductance of the transconductance amplifier; and a second current mirror having a reference current branch coupled with an output current branch of the first current mirror, and multiple output current branches, the output current branches being selectably coupled with the sources of the FETs of the transconductance amplifier.

In some implementations, the current-to-voltage convertor includes a pair of bipolar transistors; bases of the bipolar ransistors are coupled together; emitters of the bipolar transistors are coupled with the input of the current-to-voltage convertor; and collectors of the bipolar transistors are coupled with the output of the current-to-voltage convertor. In some cases, the current-to-voltage convertor includes a pair of resistors coupled with the collectors of the bipolar transistors at the output of the current-to-voltage convertor.

In some implementations, the integrated circuit chip includes two or more high-pass filters, of which the above high-pass filter is one; two or more transconductance amplifiers, of which the above transconductance amplifier is one, where each of the two or more transconductance amplifiers is coupled with a respective one of the two or more high-pass filters; and two or more differential transmission lines, of which the above differential transmission line is one. Here, first ends of each of the two or more differential transmission lines are coupled with a respective one of the two or more transconductance amplifiers, and second, opposing ends of each of the two or more differential transmission lines are coupled with the input of the current-to-voltage convertor. In some cases, the integrated circuit chip can include a current signal multiplexer through which the opposing ends of each of the two or more differential transmission lines are coupled with the input of the current-to-voltage convertor. In some cases, respective parasitic capacitances of the two or more differential transmission lines are different for at least some of the two or more differential transmission lines.

In some implementations, the integrated circuit chip includes two or more high-pass filters, of which the above high-pass filter is one; two or more transconductance amplifiers, of which the above transconductance amplifier is one, each of the transconductance amplifiers is coupled with a respective one of the two or more high-pass filters; two or more current-to-voltage convertors, of which the above current-to-voltage convertor is one; and two or more differential transmission lines, of which the above differential transmission line is one. Here, first ends of each of the two or more differential transmission lines are coupled with a respective one of the two or more transconducta.nce amplifiers, and second, opposing ends of each of the differential transmission lines are coupled with a respective one of the two or more current-to-voltage convertors.

In some implementations, the integrated circuit chip includes a voltage signal multiplexer coupled with outputs of each of the two or more current-to-voltage convertors. In some implementations, respective parasitic capacitances of the two or more differential transmission lines are different for at least some of the two or more differential transmission lines.

The disclosed technologies result in one or more of the following potential advantages, in various embodiments. The disclosed combination of a transconductance amplifier and a current-to-voltage converter causes the bandwidth of a preamplifier system fabricated in accordance with the claimed technologies to be larger than the bandwidth of a voltage buffer-based conventional preamplifier system. This is accomplished because the disclosed combination enables (i) lossless transmission of a high-pass filtered current signal over a 100 s-1000 s of microns long trace, followed by (ii) low input impedance conversion of the transmitted high-pass filtered current signal to a high-pass filtered voltage signal prior to delivery of the high-pass filtered voltage signal to a subsequent gain stage, In contrast, a voltage buffer-based conventional preamplifier system, causes lossy transmission of a high-pass filtered voltage signal over the foregoing trace, prior to delivery of a much attenuated transmitted high-pass filtered voltage signal to a subsequent gain stage.

A current established through field-effect transistors (FETs) of the transconductance amplifier is reused by bipolar transistors of the current-to-voltage converter, which causes the preamplifier system to have high power efficiency, without necessitating additional current sources.

In trast to having to carefully control common mode voltage $V_{CMB}$ of a high-pass filter of a conventional voltage buffer-based preamplifier system, the common mode voltag $V_{CM}$ used for the current-to-voltage converter is readily set/controlled. That is so, because an exact value for the common mode voltage $V_{CM}$ is not critical, as any bias voltage $V_{CM}$, applied to bases of the bipolar transistors of the current-to-voltage converter, that satisfies $V_{CM}=V_{base}<V_{collector}$, will keep the bipolar transistors functioning properly. Note however, that a value of common mode voltage $V_{CM}=V_{base}$ should exceed a minimum value in order to provide headroom to the bipolar transistors.

Further, the gain of the transconductance amplifier is readily programmed by tuning a tail current using a tracking circuit. In this manner, a bandwidth of the disclosed preamplifier system is not susceptible to process voltage temperature (PVT) variation, as is the bandwidth of a conventional voltage buffer-based preamplifier system, because a peaking frequency of the boosted voltage buffer is susceptible to PVT.

Furthermore, feedforward capacitors $C_{FF}$ (that have large capacitance and size) used as part of a conventional voltage buffer-based preamplifier system are omitted from a preamplifier system fabricated in accordance with the disclosed technologies.

Certain illustrative aspects of the disclosed technologies are described herein in connection with the following description and the accompanying figures. These aspects are, however, indicative of but a few of the various ways in which the principles of the disclosed technologies may be employed and the disclosed technologies are intended to include all such aspects and their equivalents. Other advantages and novel features of the disclosed technologies may become apparent from the following detailed description when considered in conjunction with the figures.

DETAILED DESCRIPTION

Figure 1:
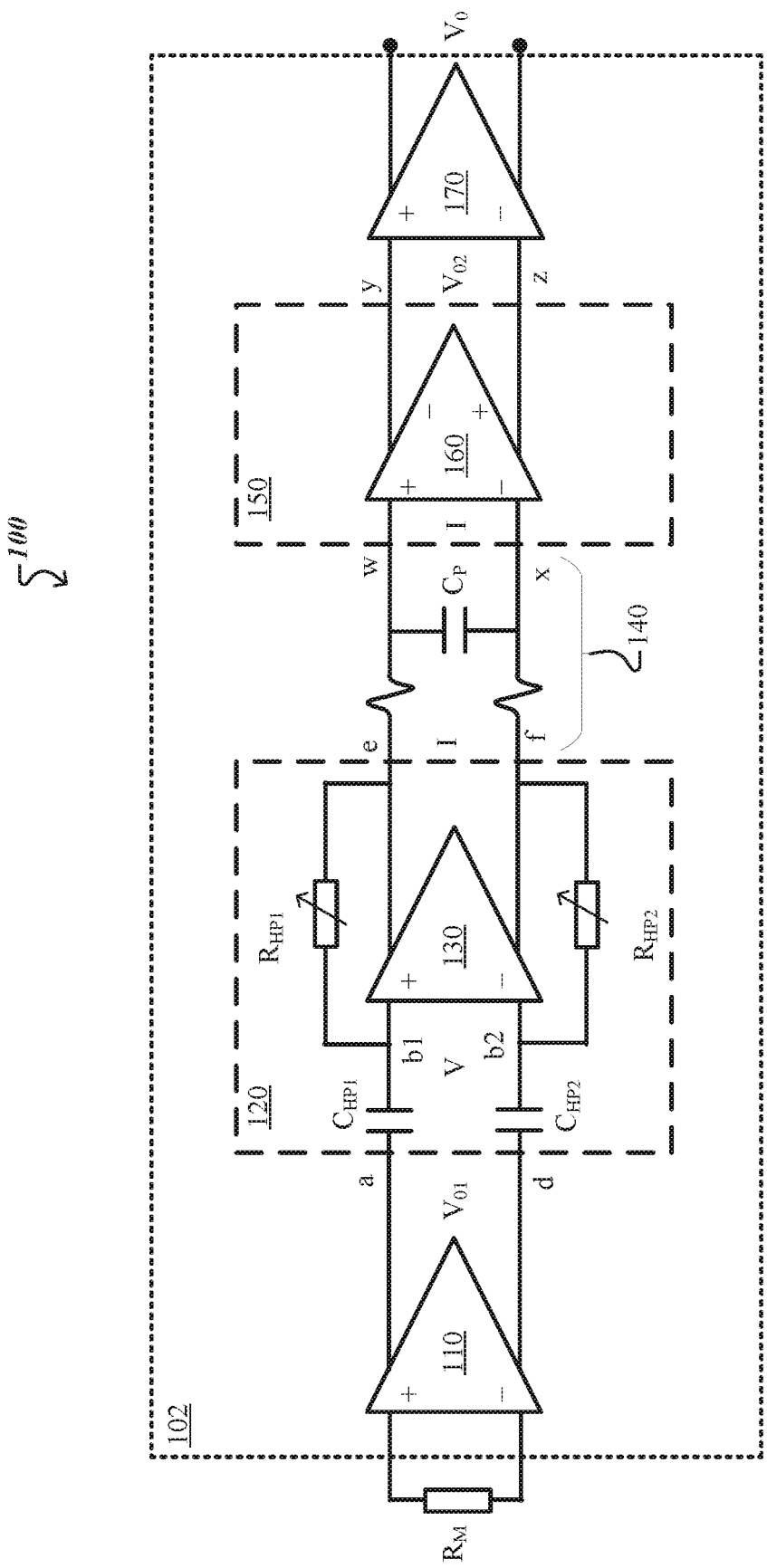
FIG. 1 shows an example of a preamplifier system that includes a transconductance amplifier and a current-to-voltage converter coupled together through a long trace that has large capacitance.

FIG. 1 shows a preamplifier system 100 configured to (i) form a sensor signal $V_{O1}$, e.g., by using a sensor stage that includes amplifier 110, (ii) high-pass filter the sensor signal $V_{O1}$ to a high-pass filtered voltage signal V and transform the latter to a current signal I, (iii) transmit the current signal I through a trace 140 (e.g., a differential transmission line) having parasitic capacitance $C_P$ caused by a trace length in a range from hundreds of microns to thousands of microns, (iv) convert the transmitted current signal I to a voltage signal $V_{O2}$ prior to delivering it to a gain stage, e.g., to amplifier 170. Here, the long trace 140 is disposed between first stage circuitry 120 and second stage circuitry 150 of the preamplifier system 100. By converting a high-pass filtered voltage signal V into a corresponding current signal I, the current signal I is suitably transported without degradation over a relatively long differential trace 140, and then converted back to a voltage signal $V_{O2}$, that is input, at a relatively close proximity, considerably less than hundreds of microns in some embodiments, to amplifier 170.

The first stage circuitry 120 includes a high-pass filter and a transconductance amplifier 130 that, in an embodiment, is configured to receive a differential input voltage signal V and to generate an amplified differential current signal I corresponding to the input differential input voltage signal V. The second stage circuitry 150 includes a current-to-voltage converter 160. In some implementations, the amplifier 110, the first stage circuitry 120, the second stage circuitry 150, and the amplifier 170 are disposed on the same IC chip 102. In other embodiments, the amplifier 110 and the first stage circuitry 120 are disposed on a first IC chip, while the second stage circuitry 150 and the amplifier 170 are disposed on a second IC chip. The first and second IC chips are packaged together in a single IC chip package unit in some embodiments, although this need not be the case.

FIG. 1 shows that the sensor signal $V_{O1}$ is formed by amplifying, by amplifier 110, a voltage across a sensor $R_M$ (e.g., a hard drive head). The amplifier 110 is coupled with the first stage circuitry 120.

Capacitors $C_{HP1}$, $C_{HP2}$ (e.g., having a value of ~4 pF, for example, in an embodiment) are respectively connected between input ports (a.d) of the high pass filter and input ports (b1,b2) of the transconductance amplifier 130. Resistors $R_{HP1}$, $R_{HP2}$ (e.g., having values of at least 100kΩ, in some embodiments) are respectively connected between the input ports (b1,b2) of the transconductance amplifier 130 and the output ports (e,f) of the transconductance amplifier 130, and form the feedback loops of the transconductance amplifier 130. In some embodiments, the resistance of resistors $R_{HP1}$, $R_{HP2}$ is variable. Together, the capacitors $C_{HP1}$, $C_{HP2}$ and the resistors $R_{HP1}$, $R_{HP2}$ form the high-pass filter. The high-pass filter removes at least the DC component of the sensor signal $V_{O1}$ and forms a high-pass filtered signal V that is a high-pass filtered voltage signal which is input to transconductance amplifier 130. Note that the high-pass filtered signal V is a voltage signal applied to the inputs (b1,b2) of the transconductance amplifier 130. The transconductance amplifier 130 is used to convert the high-pass filtered signal V to a current signal I, where $I=g_m V$, and gm—the transconductance of the transconductance amplifier 130—is constant across PVT. In some implementations, the transconductance gm of transconductance amplifier 130 is programmable as explained below. The current signal I is output by the transconductance amplifier 130 at its output ports (e,f)

Figure 2:
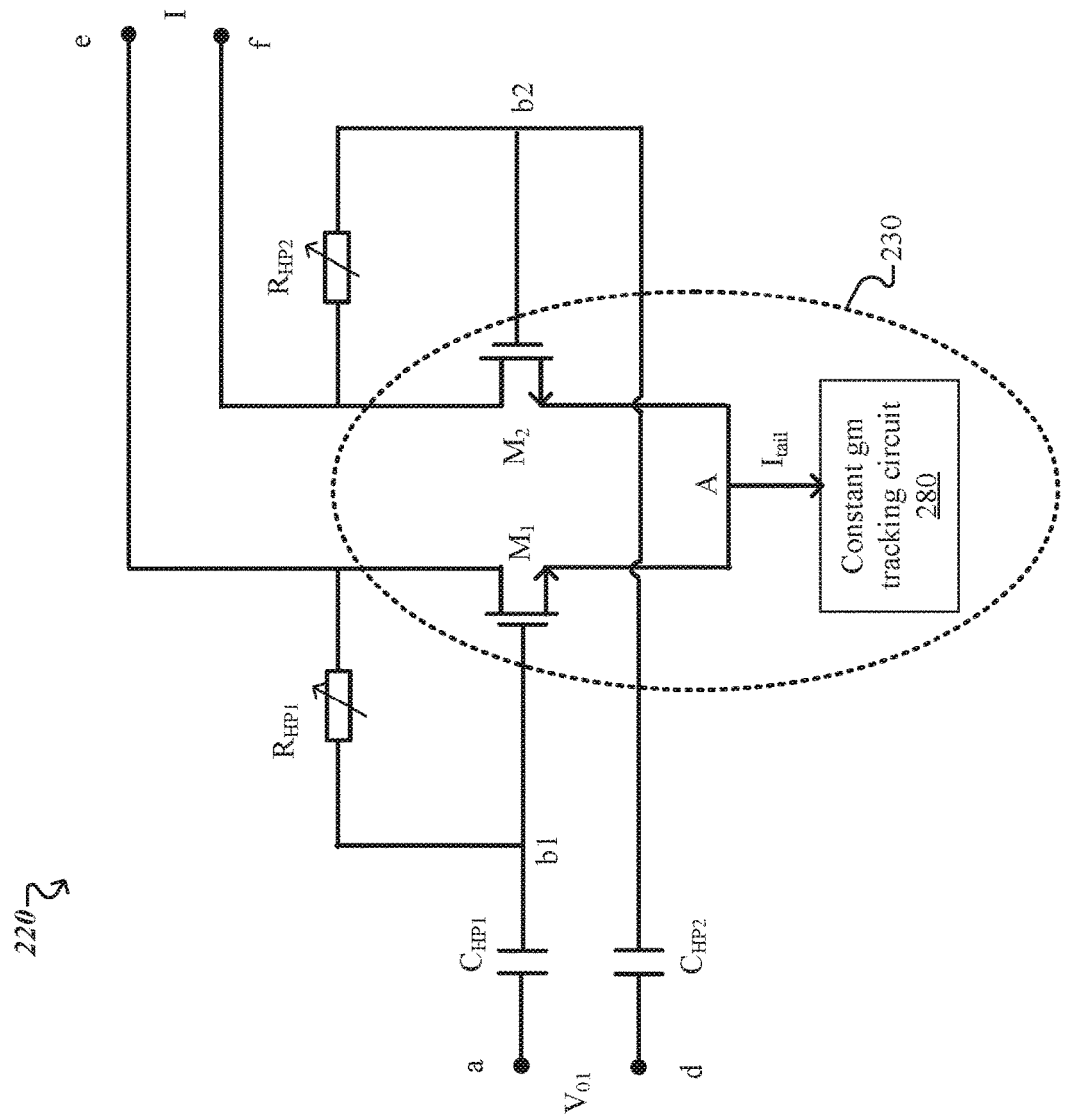
FIG. 2 shows an example of a combination of high-pass filter and a transconductance amplifier like the ones included in the preamplifier system of FIG. 1.

An example of the first stage circuitry 120 is shown in FIG. 2. The first stage circuitry 220 shown in FIG. 2 includes a high-pass filter—formed by capacitors $C_{HP1}$, $C_{HP2}$ and resistors $R_{HP1}$, $R_{RP2}$—and a transconductance amplifier 230. The capacitors $C_{HP1}$, $C_{HP2}$ of the high-pass filter are respectively connected between the input ports (a,d) of the high pass filter and input ports (b1,b2) of the transconductance amplifier 230. The resistors $R_{HP1}$, $R_{HP2}$ of the high-pass filter are respectively connected between the input ports (b1,b2) of the transconductance amplifier 230 and the output ports (e,f) of the transconductance amplifier 230, and form feedback loops of the transconductance amplifier 230. In an embodiment, the transconductance amplifier 230 includes field-effect transistors (FETs) M1, M2. For example, the FETs M1 M2 are suitably metal-oxide-semiconductor FETs (MOSFETs) or other type of FET, in an embodiment. Input ports (b1,b2) of the transconductance amplifier 230 are connected to the gates of FETs M1, M2, respectively, to receive a high-pass filtered voltage signal (called V in FIG. 1, which is a version of the sensor signal $V_{O1}$ without at least its DC component). Output ports (e, f) of the transconductance amplifier 230 are connected to the drains of FETs M1, M2, respectively, to output current signal I. Note that the current signal I corresponds to the high-pass filtered sensor signal $V_{O1}$.

Further note that a gain of the transconductance amplifier 230 is controlled (e.g., programmatically) by using a tracking circuit 280 (also referred to as a gain controller 280) coupled with the sources of FETs M1, M2. Here, the sources of FETs M1, M2 are connected together at node A. In this manner, as described below in connection with FIG. 3, the gain of the transconductance amplifier 230 is proportional to a current $I_{tail}$ delivered to the sources of FETs M1, M2, at node A, by the tracking circuit 280.

Figure 3:
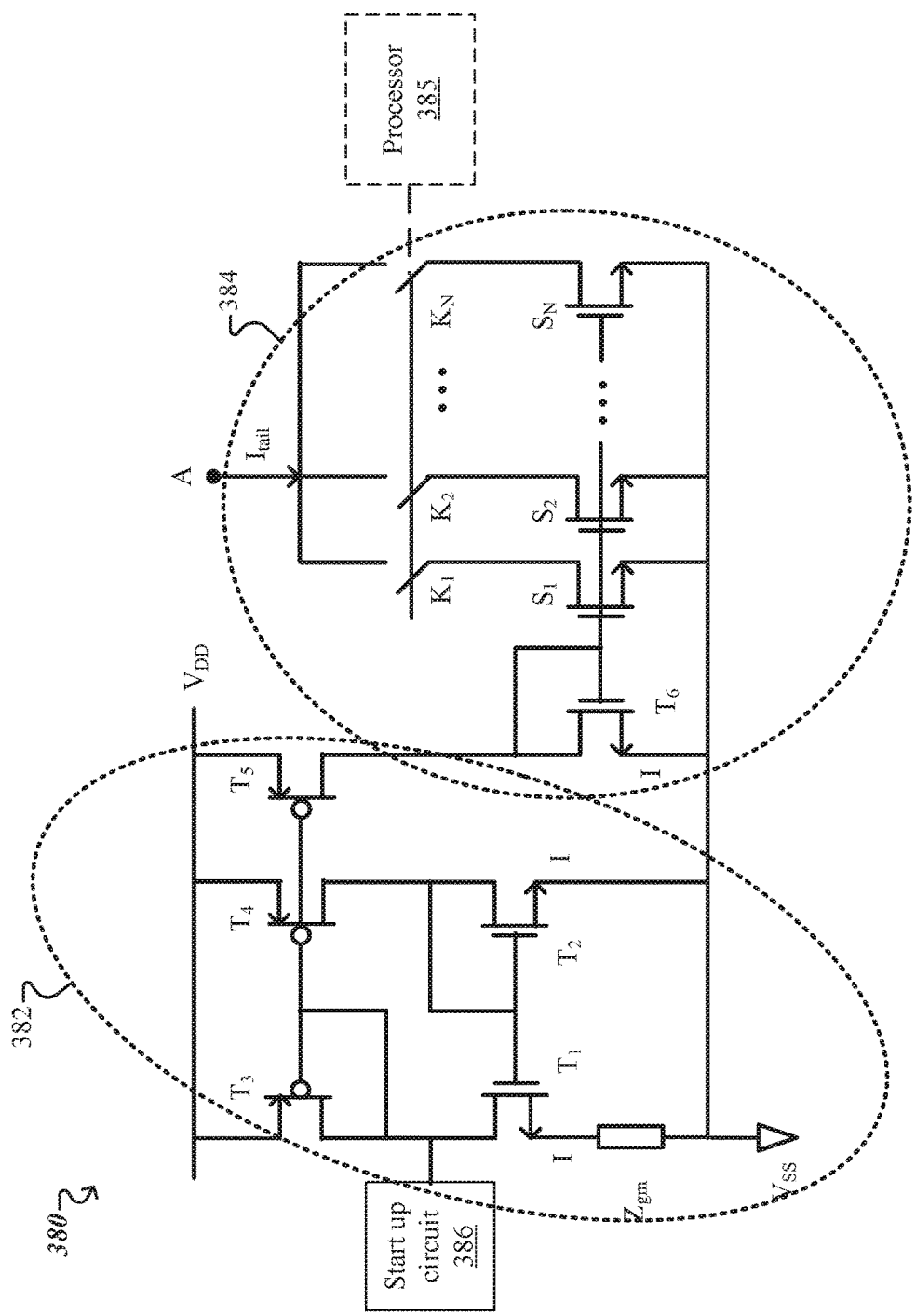
FIG. 3 shows an example of a current tracking circuit used to control gain of a transconductance amplifier like the one included in the transconductance amplifier of FIG. 2.

An implementation of the tracking circuit 280 is shown in FIG. 3. FIG. 3 shows a portion of a tracking circuit 380 that includes a first current mirror 382 and a second current mirror 384. An output of the second current mirror 384 is coupled with the node A to deliver the current $I_{tail}$ to the sources of FETs M1, M2 of the transconductance amplifier 230.

The first current mirror 382 includes transistors T1, T2, T3, T4, T5, and resistor Zgm. For example, the transistors T1, T2, T3,T4, T5 suitably are FETs, in an embodiment. Transistors T1, T2, T3, T4 are suitably arranged in a Wilson current sourceconfiguration. Moreover, the combination of transistors T1 and T2, and resistor Zgm determine a reference current (also referred to as a tracking current) $I_{REF}$. Here, the reference current $I_{REF}$ can be expressed as $$I_{REF} = \frac{\alpha}{Z_{gm}^2}, \quad (1)$$

where α, is a constant number. In this manner, the reference current $I_{REF}$ is induced in the output branch, which includes transistor T5, of the first current mirror 382. Note that the first current mirror 382 is suitably initiated using a start-up circuit 386.

The second current mirror 384 includes transistor T6 and a set of transistors S1, . . . , SN, each transistor Sj, where j=1 . . . N and N≥2, being arranged on a respective output branch of the second current mirror 382. For example, the transistors T6, S1, . . . , SN are suitably FETs. Note that the reference branch, which includes transistor T6, of the second current mirror 384 is common with the output branch, which includes transistor T5, of the first current mirror 382, and thus, the reference current of the second current mirror 384 is also the tracking current $I_{REF}$, expressed in EQ. 1. In this manner, a P-type current flow through transistor T5 is converted to an N-type current flow through transistor T6.

Moreover, each output branch of the second current mirror 384 is connected with node A through a respective switch $K_j$, where j=1 . . . N. In this manner, the current hail delivered by the second current mirror 384 to node A is suitably adjusted (e.g., programmatically) in increments of $\pm I_{REF}/N$, depending on how many of the switches $K_1, \ldots, K_N$ are turned ON or OFF along respective output branches of the second current mirror 384. The foregoing (e.g., programmatic) adjustments of current $I_{tail}$ result in fine tuning of the gain of the transconductance amplifier 230. Such adjustments are performed, e.g., in some implementations, using a processor 385 linked with the switches $K_1, \ldots, K_N$ to tune the gain of the transconductance amplifier 230 to compensate for shifts in the gain of either the sensor stage the gain of amplifier 110) or the gain stage (e.g., the gain of amplifier 170). Such tuning is suitably performed either before shipping the preamplifier system 100, or in the field. In some implementations, the processor 385 is disposed on the same IC chip 102 as the first stage circuitry 120. In other implementations, the processor 385 is disposed on another chip in communication with the IC chip 102.

Referring now to FIG. 2, transconductance gm of the transconductance amplifier 230 satisfies, in view of EQ. 1, the following equation:

$$\sqrt{I} = \frac{\sqrt{\alpha}}{Z_{gm}}. \quad (1')$$

As disclosed above, I is the current output by the transconductance amplifier 230, and $Z_{gm}$ is the resistance corresponding to the transconductance gm. In view of EQ. 1', the transconductance gm of the transconductance amplifier 230 can be expressed in terms of the resistance $Z_{gm}$, in the following manner:

$$g_{m(M_1,M_2)} = \beta \cdot \sqrt{I} = \frac{k}{Z_{gm}}. \quad (2)$$

Here, β and k are constant numbers. In view of EQ. 2, the gain of the transconductance amplifier 230 can be expressed in the following manner:

$$\text{Gain} = g_m \cdot Z_R = \gamma \cdot \frac{Z_R}{Z_{gm}}. \quad (3)$$

Here, $Z_R$ is a load resistance and γ is a constant number. As the resistances $Z_R$ and $Z_{gm}$ are constant, the gain of the transconductance amplifier 230 is constant across PVT.

Referring now to FIG. 1, the current signal I output by the first stage circuitry 120 at output ports (e,f) of the transconductance amplifier 130 is transported over the long trace 140 to the second stage circuitry 150. The transported current signal I is applied at the input ports (w, x) of the current-to-voltage converter 160. The current-to-voltage converter 160 is used to convert the transported current signal I to a voltage signal $V_{O2}$. The voltage signal $V_{O2}$ is output by the current-to-voltage converter 160 at its output ports (y,z).

Figure 4:
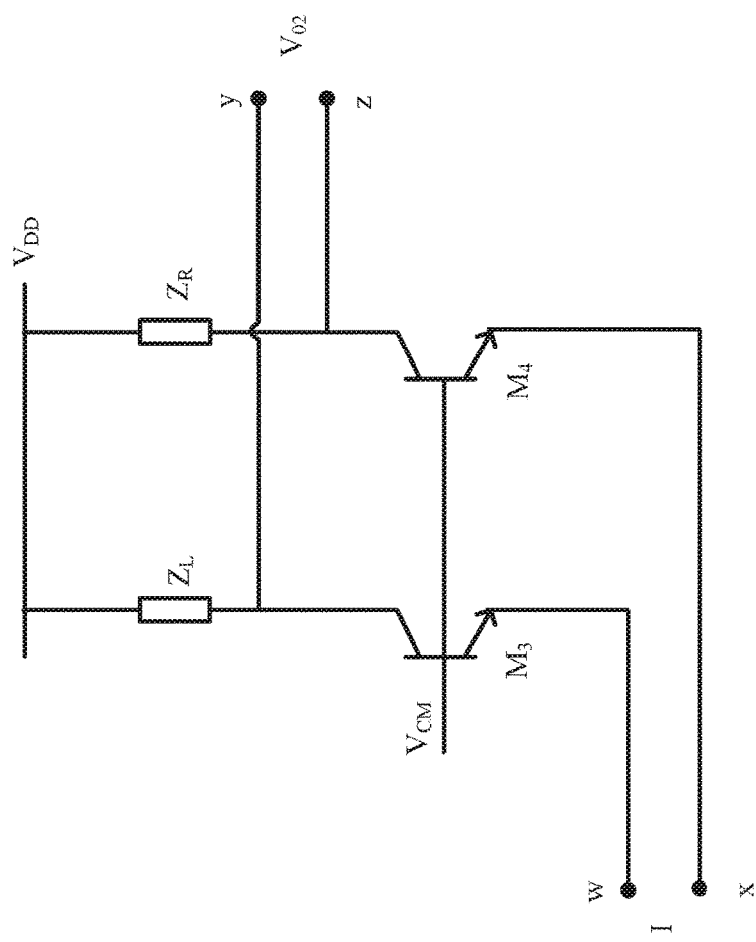
FIG. 4 shows an example of a current-to-voltage converter like the one included in the preamplifier system of FIG. 1.

An example of the current-to-voltage converter 160 is shown in FIG. 4. The current-to-voltage converter 460 shown in FIG. 4 includes bipolar transistors M3, M4 and impedance elements $Z_L$, $Z_R$ connected to the respective collectors of bipolar transistors M3, M4. In some implementations, the impedance elements $Z_L$, $Z_R$ are resistors. In other implementations, in order to boost a bandwidth of the current-to-voltage converter 160, the impedance elements $Z_L$, $Z_R$ include resistors and one or more inductors. Here, the bases of bipolar transistors M3, M4 are connected together to a common mode voltage $V_{CM}$. Input ports (w,x) of the current-to-voltage converter 460 are connected to the emitters of bipolar transistors M3, M4, respectively, to receive a current signal I, which corresponds to the sensor signal $V_{O1}$ without at least its DC component. Output ports (y, z) of the current-to-voltage converter 460 are connected between the respective collectors of bipolar transistors M3, M4 and the respective impedance elements $Z_L$, $Z_R$, to output the voltage signal $V_{O2}$.

Referring again to FIG. 1, the voltage signal $V_{O2}$ output by the second stage circuitry 150 is delivered to a gain stage that includes amplifier 170. Note that, for circuits illustrated in FIGS. 1-4, the voltage signal $V_{O2}$ is a high-pass filtered version of the sensor signal $V_{O1}$, in accordance with a transfer function calculated below.

$$\frac{V_{O2}}{V_{O1}} = \frac{S\tau_0}{1+S\tau_0} \frac{1}{1+S\tau_3} g_{M1} Z_L, \quad (4)$$

where $$\tau_0 = R_{HP} C_{HP}, \text{ and } \tau_3 = \frac{C_P}{g_{M3}}.$$

Here, $g_{M3}$ is the transconductance $g_M$ of bipolar transistor M3 shown in FIG. 4, $g_{m1}$ is the transconductance $g_M$ of FET M1 shown in FIG. 2. Also, the low corner frequency, $$f_{3dB} = \frac{1}{2\pi\tau_3},$$

of the preamplifier system 100 is smaller than the low corner frequency of a conventional voltage buffer-based preamplifier system by a ratio of the transconductance $g_{M3}$ and a transconductance of the input FET of the conventional voltage buffer-based preamplifier system.

The technologies described above in connection with FIGS. 1-4 can result in one or more of the potential advantages presented below. The combination of transconductance amplifier 130 and current-to-voltage converter 160 causes the bandwidth of the preamplifier system 100 to be larger than the bandwidth of a conventional voltage buffer-based preamplifier system, as discussed above in connection with EQ. 4. This is accomplished because the disclosed combination enables (i) lossless transmission of a high-pass filtered current signal over a 100 s- 1000 s of microns long trace, followed by (ii) low input impedance conversion of the transmitted high-pass filtered current signal to a high-pass filtered voltage signal prior to delivery of the high-pass filtered voltage signal to a subsequent gain stage. In contrast, a conventional voltage buffer-based preamplifier system, causes lossy transmission of a high-pass filtered voltage signal over the foregoing trace, prior to delivery of a much attenuated transmitted high-pass filtered voltage signal to a subsequent gain stage.

The current established through FETs M1, M2 of the transconductance amplifier 130 is reused by the bipolar transistors M3, M4 of the current-to-voltage converter 160, which causes high power efficiency of the preamplifier system 100, as no additional current sources are needed.

In contrast to having to carefully control a common mode voltage $V_{CBM}$ of a high-pass filter of a conventional voltage buffer-based preamplifier system, the common mode voltage $V_{CM}$ used for the current-to-voltage converter 160/460 is readily set/controlled, in some embodiments. That is so, as the exact common mode voltage $V_{CM}$ is not critical, because any bias voltage $V_{CM}$ applied to bases of bipolar transistors M3, M4, that satisfies $V_{CM}=V_{base}<V_{collector}$, will keep the bipolar transistors M3, M4 functioning properly. Of course, $V_{CM}=V_{base}$ should not be set so low as to not leave the bipolar transistors M3, M4 some headroom.

Further, a gain of the transconductance amplifier 130/230 is readily programmed by tuning a tail current $I_{tail}$ using tracking circuitry 280/380, in some embodiments, as shown in FIGS. 2-3. This is suitably configured as gain trimming part for the whole preamplifier system 100.

Furthermore, large size and value feedforward capacitors typically used as part of a conventional voltage buffer-based preamplifier system are omitted from the preamplifier system 100. In this manner, the susceptible peaking frequency for bandwidth boosting is avoided.

Moreover, the technologies described above in connection with FIGS. 1-4 suitably are used to fabricate pre-amplifier systems to pre-amplify multiple sensor signals, e.g., as part of a multi-head hard drive system.

Figure 5A:
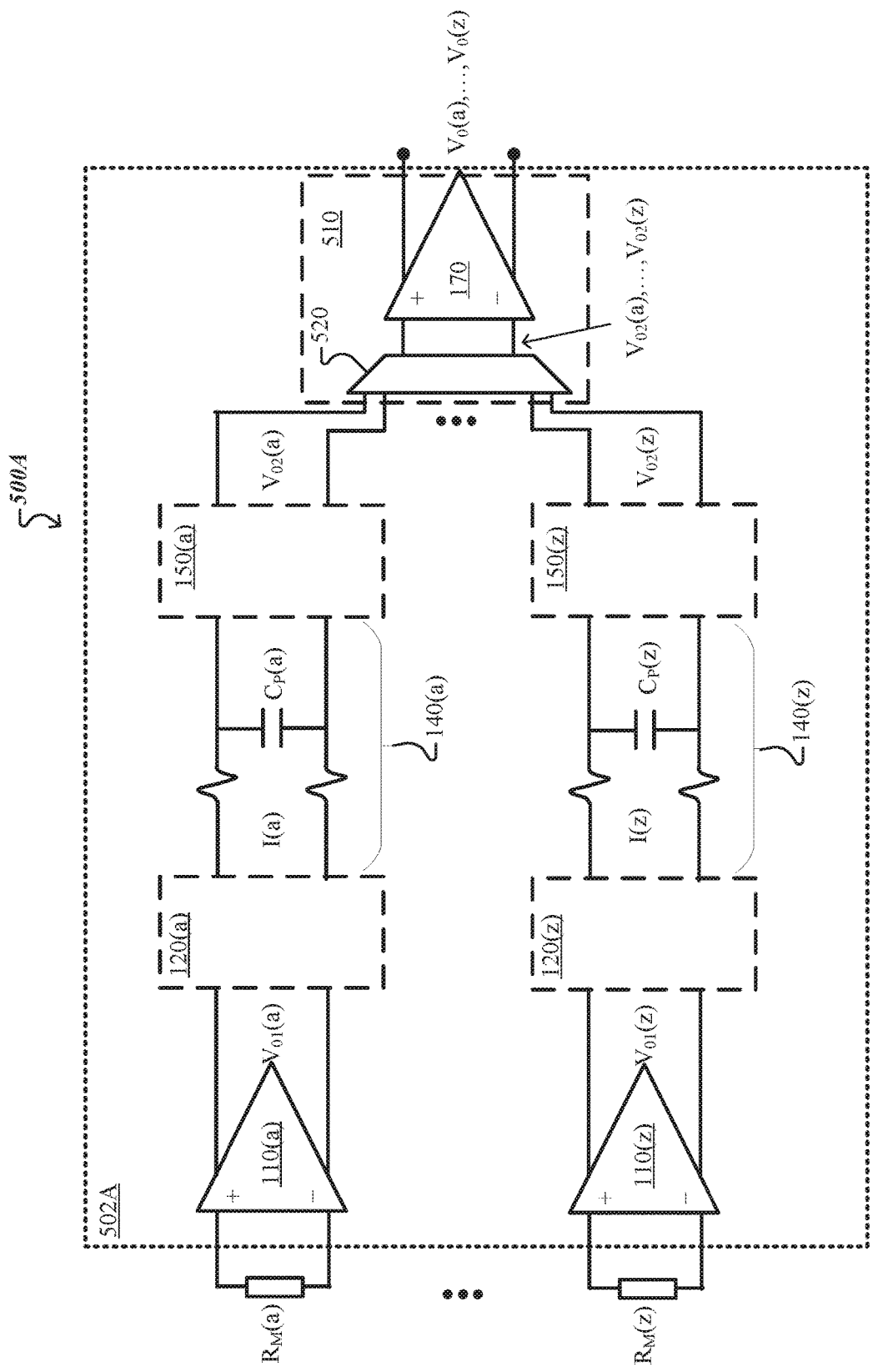
FIG. 5A shows an example of a preamplifier system, like the preamplifier system of FIG. 1, for processing multiple sensor signals.
Figure 5B:
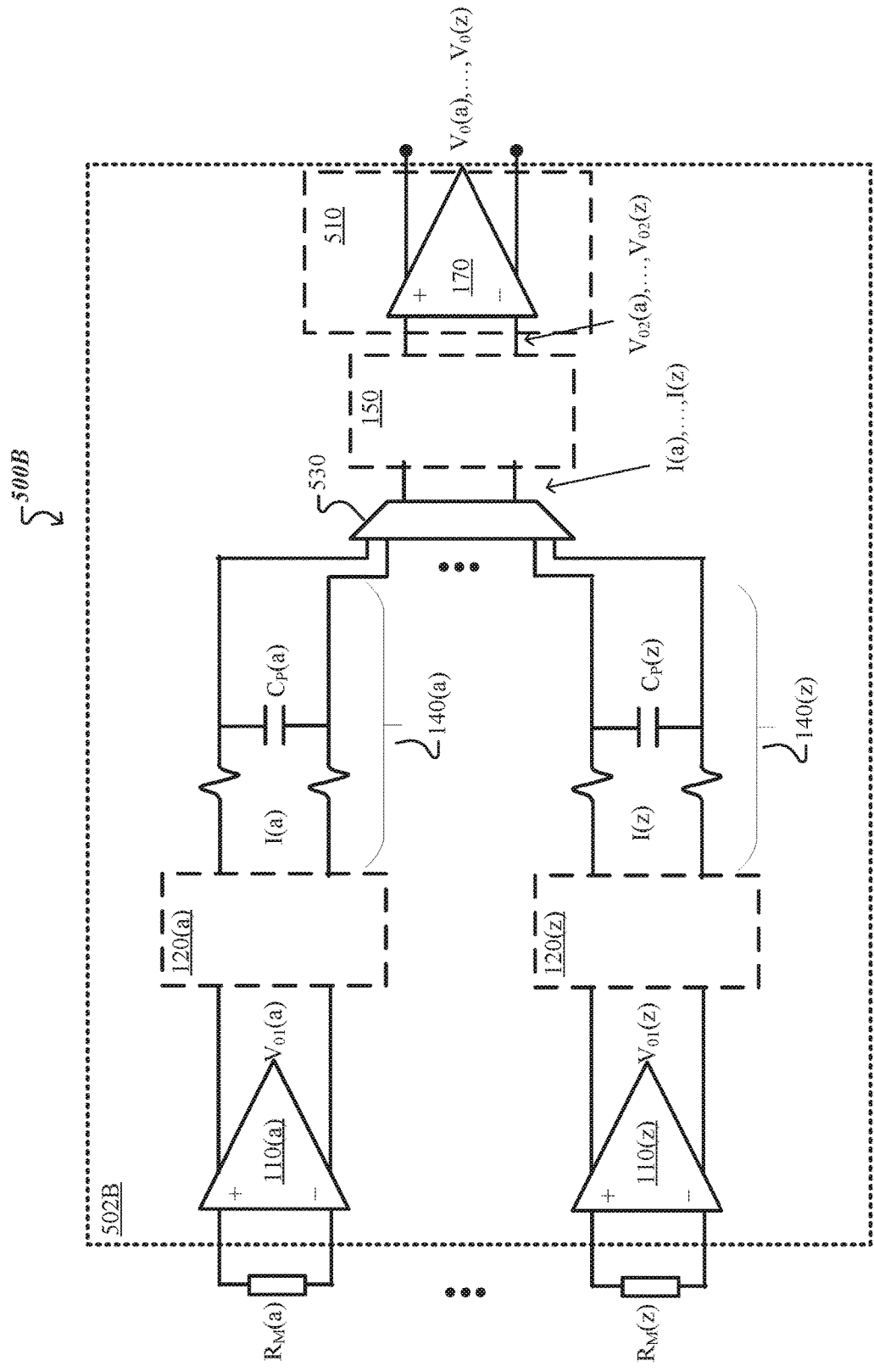
FIG. 5B shows another example of a preamplifier system, like the preamplifier system of FIG. 1, for processing multiple sensor signals.

FIG. 5A shows a first implementation of a pre-amplifier system 500A fabricated on a first single IC chip 502A, and FIG. 5B shows a second implementation of a pre-amplifier system 500B fabricated on a second single IC chip 502B. While illustrated as being a single IC chip 502A, 502B, it is noted that, in some embodiments, electronic components on either terminal of traces 140(a), 140(z) are disposed on separate IC chips that, depending on implementation, may or may not be co-located in the same IC package unit. In these examples, the pre-amplifier system 500A or 500B is configured to (i) form two or more sensor signals $V_{O1}(a), \ldots, V_{O1}(z)$, e.g., 2, 4, 8 or other even integer number of sensor signals, using respective two or more amplifiers 110a, . . . , 110(z); (ii) high-pass filter and transform the sensor signals $V_{O1}(a), \ldots, V_{O1}(z)$ to respective current signals I(a), I(z), using respective first stage circuitry 120(a), . . . , 120(z), like the first stage circuitry 120 described above in connection with FIG. 1, and the first stage circuitry 220 described above in connection with FIG. 2; and (iii) transmit the respective current signals I(a), . . . , I(z) towards a gain stage 510, (which includes, e.g., amplifier 170), through respective traces 140(a), . . . , 140(z) (e.g., respective differential transmission lines). The have traces 140(a), . . . , 140(z) have respective parasitic capacitances $C_P(a), \ldots, C_P(z)$ because they have trace lengths in the range of 100 s to 100 s of microns. Moreover, at least some of the traces 140(a), . . . , 140(z) have different $C_P$ values from other traces, because of their different respective trace lengths, different conductivities or because they are routed through different layers of an integrated semiconductor circuit, In the example illustrated in FIG. 5A, the pre-amplifier system 500A is configured to (iv) convert the transmitted current signals I(a), . . . , I(z) to respective pre-amplified voltage signals $V_{02}(a), \ldots , V_{02}(z)$, using respective second stage circuitry 150(a), . . . , 150(z), life the second stage circuitry 150 described above in connection with FIGS. 1 and 4. Here, each of the second stage circuitry 150(a), . . . , 150(z) includes a current-to-voltage converter 160/460 as described above in connection with FIGS. 1 and 4. Subsequently, the pre-amplified voltage signals $V_{02}(a), \ldots , V_{02}(z)$ are input to a single amplifier 170. In some implementations, the pre-amplified voltage signals $V_{02}(a), \ldots , V_{02}(z)$ are input to the single amplifier 170 using a voltage signal multiplexer 520. The voltage signal multiplexer 520 is a multiplexer configured to multiplex two or more voltage signals $V_{02}(a), \ldots , V_{02}(z)$ and to provide a multiplexed voltage signal $\{V_{02}(a), \ldots , V_{02}(z)\}$.

In the example illustrated in FIG. 5B, the pre-amplifier system 500B is configured to deliver the transmitted current signals I(a), . . . , I(z) to a single second stage circuitry 150, like the second stage circuitry 150 described above in connection with FIGS. 1 and 4. Here, the transmitted current signals 1(a), . . . , I(z) are provided to the single second stage circuitry 150 using a current signal multiplexer 530. The current signal multiplexer 530 is a multiplexer configured to multiplex two or more current signals I(a), . . . , I(z) and to provide a multiplexed current signal $\{I(a), \ldots , I(z)\}$. Further in this example, the pre-amplifier system 500B is configured to (iv) convert the multiplexed current signal $\{I(a), \ldots , I(z)\}$ to a multiplexed pre-amplified voltage signal $\{V_{02}(a), \ldots , V_{02}(z)\}$ prior to inputting the multiplexed pre-amplified voltage signal to a single amplifier 170.

In both of the examples illustrated in FIGS. 5A-5B, amplifier 170 amplifies the multiplexed pre-amplified voltage signal $\{V_{02}(a), \ldots , V_{02}(z)\}$ and issues an amplified multiplexed signal $\{V_0(a), \ldots , V_0(z)\}$. Note that in both pre-amplifier system 500A and 500B the different current signals I(a), . . . , I(z) are transmitted over respective differential transmission lines 140(a), . . . , 140(z) that can have significantly different lengths compared to each other, because current transmission is substantially lossless, as explained above in connection with FIG. 1. In contrast, the amplifier 170 is disposed adjacent to the second stage(s) 150 (150(a), . . . , 150(z)), that includes the current to voltage converter(s) 160 (160(a), . . . , 160(z)), so the pre-amplified multiplexed voltage signal $\{V_{02}(a), \ldots , V_{02}(z)\}$ is provided to the amplifier 170 with minimal losses, e.g., over a single short length differential transmission line. In addition, each element of the pre-amplified multiplexed voltage signal $\{V_{02}(a), \ldots , V_{02}(z)\}$ is subject to the same transmission losses as it is transmitted from the second stage(s) 150 (150(a), . . . , 150(z)) over the same differential transmission line to the amplifier 170.

A few implementations have been described in detail above, and various modifications are possible. While this specification contains many specifics, these should not be construed as limitations on the scope of what may be claimed, but rather as descriptions of features that may be specific to particular implementations. Certain features that are described in this specification in the context of separate implementations can also be configured in combination in a single implementation. Conversely, various features that are described in the context of a single implementation can also be configured in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system ponents in the implementations described above should not be understood as requiring such separation in all implementations.

Other implementations fall within the scope of the following claims.

What is claimed is:

1. A preamplifier system for pre-amplifying input voltage signals to pre-amplified voltage signals, the system comprising:
   first circuitry configured to
      receive an input voltage signal;
      high-pass filter the input voltage signal to obtain a high-pass filtered voltage signal; and
      process the high-pass filtered voltage signal to obtain a current signal that corresponds to the high-pass filtered voltage signal; and
   second circuitry configured to
      receive the current signal from the first circuitry through a differential transmission line;
      convert the received current signal to obtain a converted voltage signal that corresponds to the high-pass filtered voltage signal; and
      output the converted voltage signal as a pre-amplified voltage signal;
   wherein the system comprises two or more instances of the first circuitry each of which is configured to receive a respective input voltage signal and obtain a respective current signal that corresponds to an associated input voltage signal that has been high-pass filtered, and
   wherein the second circuitry is configured to receive from each instance of the first circuitry the respective current signal through a corresponding one of two or more differential transmission lines, and convert the respective current signal to an associated pre-amplified voltage signal that corresponds to the associated input voltage signal that has been high-pass filtered.

2. The system of claim 1, wherein the high-pass filter operation is performed by the first circuitry in a programmatic manner.

3. The system claim 1, wherein
   the first circuitry is configured to control a level of the current signal transmitted over the differential transmission line, and
   the control operation is performed by the first circuitry in a programmatic manner.

4. The system of claim 1, wherein the first circuitry is configured to
   receive a sensor signal from a sensor; and
   form the input voltage signal from the received sensor signal.

5. The system of claim 1, wherein
   the first circuitry, the differential transmission line and the second circuitry are implemented on a single integrated circuit chip, or on two or more integrated circuit chips that are packaged together in an integrated circuit package unit, or
   the system is a system on chip.

6. The system of claim 1, comprising a current signal multiplexer configured to multiplex the two or more current signals transmitted through the respective two or more differential transmission lines, and provide a multiplexed current signal to the second circuitry.

7. The system of claim 6, wherein the high-pass filter operation is performed by the first circuitry in a programmatic manner.

8. The system claim 6, wherein
the first circuitry is configured to control a level of the current signal transmitted over the differential transmission line, and
the control operation is performed by the first circuitry in a programmatic manner.

9. The system of claim 6, wherein the first circuitry is configured to
receive a sensor signal from a sensor; and
form the input voltage signal from the received sensor signal.

10. A preamplifier system for pre-amplifying input voltage signals to pre-amplified voltage signals, the system comprising:
first circuitry configured to
receive an input voltage signal;
high-pass filter the input voltage signal to obtain a high-pass filtered voltage signal; and
process the high-pass filtered voltage signal to obtain a current signal that corresponds to the high-pass filtered voltage signal; and
second circuitry configured to
receive the current signal from the first circuitry through a differential transmission line;
convert the received current signal to obtain a converted voltage signal that corresponds to the high-pass filtered voltage signal; and
output the converted voltage signal as a pre-amplified voltage signal;
wherein the system comprises
two or more instances of the first circuitry each of which is configured to receive a respective input voltage signal and obtain a respective current signal that corresponds to an associated input voltage signal that has been high-pass filtered; and
two or more instances of the second circuitry each of which is configured to receive from a corresponding instance of the first circuitry the respective current signal through a corresponding one of two or more differential transmission lines, and convert the respective current signal to an associated pre-amplified voltage signal that corresponds to the associated input voltage signal that has been high-pass filtered.

11. The system of claim 10, wherein
the first circuitry, the differential transmission line and the second circuitry are implemented on a single integrated circuit chip, or on two or more integrated circuit chips that are packaged together in an integrated circuit package unit, or
the system is a system on chip.

12. The system of claim 10, comprising a voltage signal multiplexer configured to multiplex the two or more pre-amplified voltage signals provided by the respective instances of the second circuitry, and output a multiplexed pre-amplified voltage signal.

13. A method for pre-amplifying an input voltage signal to a pre-amplified voltage signal, the method comprising:
receiving the input voltage signal;
obtaining a high-pass filtered voltage signal by applying a high-pass filter to the input voltage signal;
processing, by transconductance circuitry, the high-pass filtered voltage signal to a current signal that corresponds to the high-pass filtered voltage signal, and outputting the current signal at a differential output of the transconductance circuitry, the differential output being connected to a first end of a differential transmission line;
transmitting the current signal through the differential transmission line from the first end to a second, opposing end of the differential transmission line, the second end being connected to a differential input of current-to-voltage converting circuitry;
converting, by the current-to-voltage converting circuitry, the transmitted current signal to a converted voltage signal that corresponds to the high-pass filtered voltage signal; and
outputting the converted voltage signal as the pre-amplified voltage signal, wherein the input voltage signal, the high-pass filtered voltage signal, the current signal and the pre-amplified voltage signal are differential signals.

14. The method of claim 13, wherein the high-pass filter is applied in a programmatic manner.

15. The method of claim 13, further comprising controlling, in a programmatic manner, a level of the current signal transmitted over the differential transmission line.

16. The method of claim 13, comprising:
receiving a sensor signal from a sensor, wherein the sensor signal is a differential signal; and
forming the input voltage signal from the received sensor signal.

17. The method of claim 13, comprising:
receiving, by a gain stage, the pre-amplified voltage signal from the current-to-voltage converting circuitry; and
amplifying, by the gain stage, the received pre-amplified voltage signal.

18. The method of claim 13, comprising:
receiving two or more input voltage signals and obtaining two or more current signals that correspond to the respective input voltage signals that have been high-pass filtered;
transmitting the two or more current signals through corresponding two or more differential transmission lines; and
converting the transmitted current signals to respective two or more pre-amplified voltage signals that correspond to the two or more input voltage signals that have been high-pass filtered.

19. The method of claim 18, comprising multiplexing the two or more current signals transmitted through the respective two or more differential transmission lines to a multiplexed current signal prior to converting the multiplexed current signal to a multiplexed pre-amplified voltage signal.

20. The method of claim 18, comprising multiplexing the two or more pre-amplified voltage signals to a multiplexed pre-amplified voltage signal.

\* \* \* \* \*